US012684901B2

(12) United States Patent
Ebbecke

(10) Patent No.: US 12,684,901 B2
(45) Date of Patent: Jul. 14, 2026

(54) OPTOELECTRONIC DEVICE HAVING QUANTUM WELL INTERMIXING AND METHOD FOR PROCESSING THE SAME

(71) Applicant: ams-OSRAM International GmbH, Regensburg (DE)

(72) Inventor: Jens Ebbecke, Helchenbach (DE)

(73) Assignee: ams-OSRAM International GmbH, Regensburg (DE)

( * ) Notice: Subject to any disclaimer, the term of this patent is extended or adjusted under 35 U.S.C. 154(b) by 436 days.

(21) Appl. No.: 18/566,535

(22) PCT Filed: Jun. 8, 2021

(86) PCT No.: PCT/EP2021/065345
§ 371 (c)(1),
(2) Date: Dec. 1, 2023

(87) PCT Pub. No.: WO2022/258154
PCT Pub. Date: Dec. 15, 2022

(65) Prior Publication Data
US 2024/0250207 A1 Jul. 25, 2024

(51) Int. Cl.
H10H 20/812 (2025.01)
H10H 20/81 (2025.01)
H10H 20/819 (2025.01)

(52) U.S. Cl.
CPC ........ H10H 20/812 (2025.01); H10H 20/819 (2025.01); H10H 20/8215 (2025.01)

(58) Field of Classification Search
CPC . H10H 20/812; H10H 20/819; H10H 20/8215
See application file for complete search history.

(56) References Cited

U.S. PATENT DOCUMENTS

| | | | |
|---|---|---|---|
| 5,698,869 A | 12/1997 | Yoshimi et al. | |
| 6,664,605 B1 * | 12/2003 | Akulova | H01S 5/227 |
| | | | 257/432 |
| 10,396,241 B1 | 8/2019 | Perkins | |
| 2010/0020837 A1 | 1/2010 | Gan | |

(Continued)

FOREIGN PATENT DOCUMENTS

| | | | |
|---|---|---|---|
| DE | 102019126506 A1 | 4/2021 | |
| JP | S63318190 A | 12/1988 | |

(Continued)

*Primary Examiner* — Davienne N Monbleau
*Assistant Examiner* — Emily Farmer
(74) *Attorney, Agent, or Firm* — Slater Matsil, LLP

(57) ABSTRACT
In an embodiment an optoelectronic device includes a layer stack having a circumferential sidewall region and having an n-doped layer, an active region layer deposited on the n-doped layer, the active region layer having a central first portion and a surrounding second portion, a p-doped layer arranged on the active region layer, wherein the surrounding second portion comprises a p-type dopant causing a quantum well intermixing in the surrounding second portion and a thin n-doped surface layer on the circumferential sidewall extending from the n-doped layer substantially towards a top of the p-doped layer thereby forming an artificial pn-junction substantially parallel to the circumferential sidewall region and at least partially within the surrounding second portion and the p-doped layer.

18 Claims, 3 Drawing Sheets

(56)            References Cited

U.S. PATENT DOCUMENTS

| | | |
|---|---|---|
| 2017/0170360 A1 | 6/2017 | Bour et al. |
| 2020/0357949 A1 | 11/2020 | Sundgren |
| 2021/0151498 A1* | 5/2021 | Tyagi ................... H10H 20/812 |
| 2022/0384680 A1* | 12/2022 | Feix .................... H10H 20/812 |

FOREIGN PATENT DOCUMENTS

| | | |
|---|---|---|
| JP | H02128481 A | 5/1990 |
| JP | H02250386 A | 10/1990 |
| JP | H03218636 A | 9/1991 |
| JP | H05243674 A | 9/1993 |
| JP | H06275912 A | 9/1994 |
| JP | H08213622 A | 8/1996 |
| JP | H08264878 A | 10/1996 |
| JP | H08293623 A | 11/1996 |
| JP | 2002171028 A | 6/2002 |
| JP | 2010003806 A | 1/2010 |
| JP | 2013131527 A | 7/2013 |
| JP | 2021502693 A | 1/2021 |
| WO | 2018005286 A1 | 1/2018 |

* cited by examiner

OPTOELECTRONIC DEVICE HAVING QUANTUM WELL INTERMIXING AND METHOD FOR PROCESSING THE SAME

CROSS-REFERENCE TO RELATED APPLICATIONS

This patent application is a national phase filing under section 371 of PCT/EP2021/065345, filed Jun. 8, 2021, which is incorporated herein by reference in its entirety.

TECHNICAL FIELD

The present invention refers to an optoelectronic device and to a method of processing the same.

BACKGROUND

Small optoelectronic devices with a side edge length of a few ten μm or less are used in modern displays and various other applications. The devices includes a very small surface area causing their own challenges to obtain sufficient brightness at small currents. So called non-radiative recombination is a relevant issue and needs to be kept at a minimum in order to limit heat generation and obtain a higher current through the device with risking damage.

While in recent times various measures are implemented to reduce the non-radiative recombination, the desire remains to increase efficiency of small optoelectronic devices and methods for processing the same.

During manufacturing of small and very small optoelectronic devices, mesa structures are defined and generated in order to separate the various optoelectronic components from each other. Along those mesa structures, the devices may be separated. In small and very small devices, the area in-between a surrounding mesa and the circumference of the mesa itself result in a small area/circumference ratio, i.e. the edges of the optoelectronic component are relatively large compared to the enclosing area.

This results in a relatively large quantity of non-radiating recombination centers along the edges due to crystal damages, surface effects and other effects. Consequently, the quantum efficiency given by the ration radiating recombination/non-radiating recombination is reduced. To counter the above effect, it was proposed to increase the efficiency of very small InGaAlP optoelectronic devices or LEDs by diffusion of Zn to achieve quantum well intermixing (QWI).

Such QWI occurs in an area belonging to an outer area of the optoelectronic device defined in subsequent process steps. The QWI enlarges the band gap of the quantum wells in this outer area close to the edges of the mesa and the sidewall of the device, so that the charge carriers in the QWs can no longer reach the outer device surface close to the quantum wells, thus increasing the efficiency of very small InGaAlP LEDs.

However, the Zn diffusion in the outer region of the optoelectronic device in the formerly n-region, a new unwanted pn-junction is created between the Zn-diffused region and the n-doped region again close to the mesa structures. This parasitic pn-junction reduces the efficiency of the very small InGaAlP LEDs, since charge carriers at the mesa surface of this parasitic pn-junction recombine non-radiative, also referred to as non-radiative recombination, NRR.

SUMMARY

The inventors recognized that the parasitic pn-junction created by the p-type dopant to generate the QWI may nonetheless cause non-radiative recombination, NRR, particularly in this circumferential area close to the surface of the mesa structure. Embodiments provide an additional very thin n-doped layer on the lateral surface of the device. This layer, which may extend from the n-doped layer all the way through the p-doped layer covers the QWI-area and generates an artificial pn-junction at the interface between the n-doped layer on the one side and the p-doped layer and the QWI area on the other side.

Such layer can be accomplished with an additional diffusion step introducing n-type dopants with a concentration that surpasses that of the previous p-type dopant used for the QWI. The resulting artificial pn-junction has several advantages over the previous structure. For once, the pn-junction is now buried (apart from a very small area) within the material and does not reach the surface with its many NRR centers. Further, the pn-junction formed by this additional diffusion step has a larger bandgap than the central and not intermixed active region, so that the central pn-junction opens first in the forward direction. Furthermore, the n-doped surface layer is, as already mentioned, relatively thin compared to the surrounding layers. As a result, charge carrier face a large area resistance when moving through the thin surface layer. The artificial pn-junction is located further away from the central n-doped region, meaning that the charge carrier can only pass it through the thin, n-doped surface or cladding layer. Due to the larger resistance, the current through the thin surface layer and into the artificial pn-junction is significantly reduced and can almost be neglected. In any way, the numbers of NRR centers are located far away from the charge carriers and only a very small portion of the already small current reaches the pn-junction close to the remaining NRR centers. Hence, the structure with the NRR being displaced by the artificially created pn-junction will causing an improvement towards radiative recombination in the central region.

This structure is useful for small optoelectronic devices based on GaN, AlGaN, InGaAlP material system or any system in which QWI intermixing is used to prevent charge carriers from reaching the surface area of a mesa structure defining the device.

Some aspects of the present invention relate to an optoelectronic device. The device comprises a layer stack having a circumferential sidewall region and including an n-doped layer and an active region layer deposited on the n-doped layer, the active region layer having a central first portion and a surrounding second portion. A p-doped layer is arranged on the active region layer. Furthermore, the surrounding second portion comprises an additional p-type dopant causing a quantum well intermixing in the surrounding second portion. Finally, a thin n-doped surface layer is provided on the circumferential sidewall extending from the n-doped layer substantially towards a top of the p-doped layer. The thin n-doped surface layer forms an artificial pn-junction that is substantially parallel to the circumferential sidewall and also located at least partially within the surrounding second portion and the p-doped layer.

Consequently, the sidewall surface becomes n-doped, such doping covers the p-doped layer, and the QWI intermixed area of the active region. As stated previously, the artificial pn-junction provided by the n-doped surface layer on the sidewall of the device comprises a high area resistance causing only a very small parasitic current to flow. The area of pn-junction at the device surface is further reduced compared to the relatively large area of the QWI intermixed surface region at the sidewall in conventional devices.

Finally, the pn-junction comprises a larger bandgap compared to bandgap of the active region.

In some aspects, the thin n-doped surface layer comprises a thickness in the range of 10 nm to 250 nm, and in particular in the range of 50 nm to 150 nm. This thickness is thus very small compared to the active region. Quantum effect may force electrons to lower dimension when moving through the surface layer thus reducing current through this area further. In some aspects, the p-type dopant causing the QWI may extend at least partially close to the n-doped layer or even extend into it, thus creating an undesired pn-junction. This pn-junction surrounds the central portion and can have a lateral width of at least 500 nm.

The pn-junction generated by the p-type dopant and the n-doped layer may extend laterally to the surface sidewall of the device. The n-type surface layer in accordance with the proposed principle will cover this area and prevent the formation of a pn-junction at the surface of the sidewall.

Another aspect is concerned with the different dopants and material used for generating the QWI and the n-type surface layer. In some aspects, the p-type dopant comprises Zn and the n-doped surface layer comprises Te or Se. In some further aspects, the n-doped surface layer also comprises the p-type dopant being a residual of previous processing steps. However, the n-type dopant is of a higher concentration as the p-type dopant.

Other aspects are related to a method of producing an optoelectronic device in accordance with the proposed principle. After providing a carrier substrate, an n-doped layer is deposited on the carrier substrate. This process may include several preparing steps to smoothen the surface, add sacrificial layer for a subsequent rebonding process and the like.

In a subsequent step, an active region layer is formed by depositing respective layers of different material and/or dopant concentration on the n-doped layer. The active region layer may comprise one or more quantum wells. Consequently, when depositing the active region layer, one or more layers of different material composition and thus forming different bandgaps are deposited onto the n-doped layer.

After the active region is formed, a p-doped layer is deposited on the active region layer. Then a first structure mask is formed on the p-doped layer defining first areas within the active region below the first structured mask. Said first area is intended in later steps to form the active zone of the optoelectronic device.

In a subsequent step, a p-type dopant is diffused in a portion of the active region layer surrounding the first area. The p-type dopant may comprise Zn. The diffusion of the dopant into the active region layer causes a quantum well intermixing in second areas adjacent to the first areas. After the diffusion process, a second structured mask is deposited on the p-doped layer covering the first areas within the active region and parts of the second areas adjacent to the first areas. Mesa structures adjacent on parts of the second areas can then be formed, thereby exposing sidewalls extending from the first n-doped layer across a pn-junction between the first n-doped layer and a p-type doped region to the p-doped layer. The mesa structure therefore exposes the side of the device within the second area of the device that is the portion, in which the p-type dopant was diffused into.

In accordance with the proposed principle, a thin n-type surface layer is generated on the sidewalls, extending from the first n-doped layer substantially to the surface of the p-doped layer. An artificial pn-junction is created by the thin surface layer separated from the surface of the sidewalls.

Particularly the thin layer covers the QWI area on the sidewalls of the mesa structure.

The resulting mesa structure can then rebound on a temporary carrier to gain access to the n-doped layer. N-contacts can be applied and insulating layer deposited to protect the semiconductor material. In some aspects, the first structured mask may already comprise an electrically conductive material later used for the p-contacts. Likewise, for both n- and p-doped layer additional highly doped current distribution layers may be provided.

In some other aspects, the active region layer comprises non-doped or slightly n-doped layer onto the n-doped layer prior to depositing the active layer region structure. This layer may be deposited prior to forming the active layer region. In some other aspects, depositing a p-doped layer comprises depositing a non-doped or slightly p-doped layer onto the active region layer prior to depositing the p-doped layer.

For the different dopants, one or more of the following elements can be used: Tellurium, Silicon, Selenium, Magnesium and Zinc. The skilled person may realize to use other suitable elements or combination of elements. Deposition of material for doped or undoped layers can be performed by MBE, MOCVD, MOVPE, ion deposition and other suitable processes.

Other aspects relates to further parameter during the various deposition processes. In some aspects, diffusing a p-type dopant can comprise several steps. In a first step, the dopant is deposited onto the p-doped layer at a first temperature. The dopant is then diffused into the p-doped layer at a second temperature being at least partially higher than the first temperature. This may provide a better control on the diffusion depth.

In some other aspects, depositing a second structured mask comprises the step of depositing a mask layer, particularly a $SiO_2$ layer on the p-doped layer and optionally onto the first structured mask. Then the second mask on the p-doped layer is structured such that element of the structured mask in projection of the second area surrounding the first area are removed.

In some other aspects, a mesa structure is formed, by for example, etching material of the p-doped layer including the dopant, the active layer region and a portion of the n-doped region to form one or more cavities. These cavities may surround the device material thus forming the mesa structure. In some aspects, the sidewalls of the cavity are inclined with regard to a bottom of the n-doped layer in the mesa structure. The device may then form a truncated pyramid.

Some other aspects concern the formation of the thin surface layer on the sidewall of the device. An n-type dopant, in particular Te or Se may be provided onto the sidewall at a first temperature. In a subsequent step, the deposited n-type dopant is diffused into the sidewall surface at a second temperature, wherein a concentration of the deposited dopant is selected such that after diffusing deposited dopant into the sidewall-surface, the sidewall comprises a thin n-type surface layer. For the diffusion process, the second temperature may be at least for some time higher than the first temperature.

The deposition process may comprise various approaches. For example, the n-type dopant maybe evaporated or sputtered at a first temperature on the sidewall surface. Alternatively, the n-type dopant can be deposited by metalorganic vapor-phase epitaxy at a first temperature on the sidewall surface. Further alternatively, ion deposition may be sued to implant the n-type dopant on the sidewalls.

BRIEF DESCRIPTION OF THE DRAWINGS

Further aspects and embodiments in accordance with the proposed principle will become apparent in relation to the various embodiments and examples described in detail in connection with the accompanying drawings in which.

DETAILED DESCRIPTION OF ILLUSTRATIVE EMBODIMENTS

The following embodiments and examples disclose different aspects and their combinations according to the proposed principle. The embodiments and examples are not always to scale. Likewise, different elements can be displayed enlarged or reduced in size to emphasize individual aspects. It goes without saying that the individual aspects of the embodiments and examples shown in the figures can be combined with each other without further ado, without this contradicting the principle according to the invention. Some aspects show a regular structure or form. It should be noted that in practice slight differences and deviations from the ideal form may occur without, however, contradicting the inventive idea.

In addition, the individual figures and aspects are not necessarily shown in the correct size, nor do the proportions between individual elements have to be essentially correct. Some aspects are highlighted by showing them enlarged. However, terms such as "above", "above" "below", "below" "larger", "smaller" and the like are correctly represented with regard to the elements in the figures. Therefore, it is possible to deduce such relations between the elements based on the figures.

The expression "deposit on" does not mean a direct deposition; rather it shall indicate a general direction. Consequently, a first layer being deposited on a second layer can mean a direct deposition, but also a deposition with one or more additional layers in between. The expression of a "doped layer" is not restricted to a constant concentration of dopants, but rather also includes a dopant gradient along the growth direction, a sudden change or any other dopant profile. "p-type" or "n-type dopant is a dopant that causes the corresponding p-doped or n-doped region. It should be noted that generally the growth direction can be reversed as well as dopant types exchanged without deviating from the proposed principle.

Figure 1:
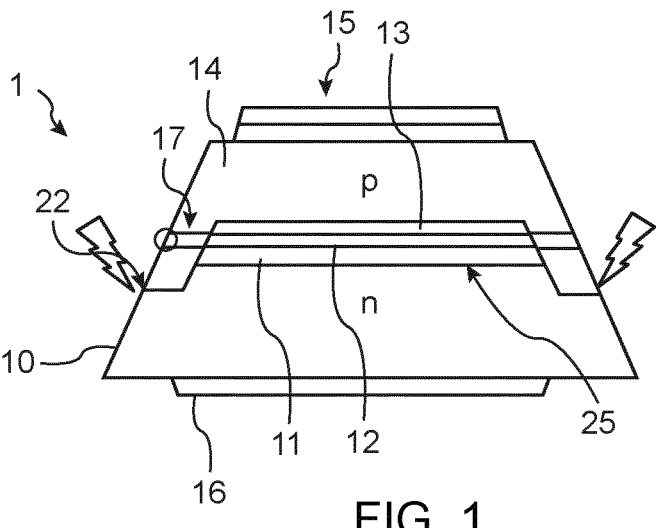
FIG. 1 shows a conventional optoelectronic device.

FIG. 1 shows a conventional optoelectronic device, in which non-radiative recombination of charge carriers are reduced due to quantum well intermixing, QWI.

The device contains a main body as a layer stack having layers 10, 11 to 13 and 14. Layer 10 comprises an n-doped material for example, GaN, GaInN, AlGaInN or similar material systems. The n-doped layer 10 is electrically contacted using an n-contact 16. The optoelectronic device also contains in its respective center a quantum well structure as an active region including layers 11, 12 and 13 on top of each other. Layer 11 arranged between quantum well layer 12 and n-doped layer 10 is an intrinsic layer of the same base material as n-doped layer 10. Quantum well layer 12 can comprise one or more quantum wells stacked on top of each other. A second intrinsic layer 13 is arranged on top of quantum well layer 12. Similar to the first intrinsic layer, the second intrinsic layer comprises the same base material as p-doped layer 13, on which p-contact 15 is deposited.

The optoelectronic device according to FIG. 1 comprises a very small light emitting surface area and may comprise a side edge length of a few μm, for example in the range from 3 μm to 15 μm. Consequently, the perimeter along the sidewall of the device at the height of or close to the active area is relatively large compared to the main area. As a result, non-radiative recombination may take place due to lattice mismatch, impurities or other effects close to the sidewall of the device at area 22.

Consequently, the conventional device implements a quantum well intermixing 17 as illustrated on the circumferential area close to the non-radiative recombination centers 22. The quantum well intermixing 17 is achieved by an additional p-type dopant diffused into areas surrounding the central area 25 of the optoelectronic device, in which radiative recombination shall take place.

However, as shown by the lightning symbol the p-doped area 17 and the n-doped layer 10 forms a residual pn-junction, which is partly within the material of the optoelectronic device but also extends lateral around the device at the surface represented by the lightning symbol. While the non-radiative recombination centers are generally reduced due to the quantum well intermixing areas 17, the residual pn-junction particularly close to the sidewalls generates new centers for non-radiative recombination. As a result, while an improvement is achieved by the quantum well intermixing, the newly generated centers 22 will still reduce the performance of the optoelectronic device as a new artificial pn-junction is created. Although this artificial pn-junction may comprise a bandgap that is larger compared to the band gap of the central active region comprising the quantum well layer 12, non-radiative recombination can nevertheless take place.

Figure 2:
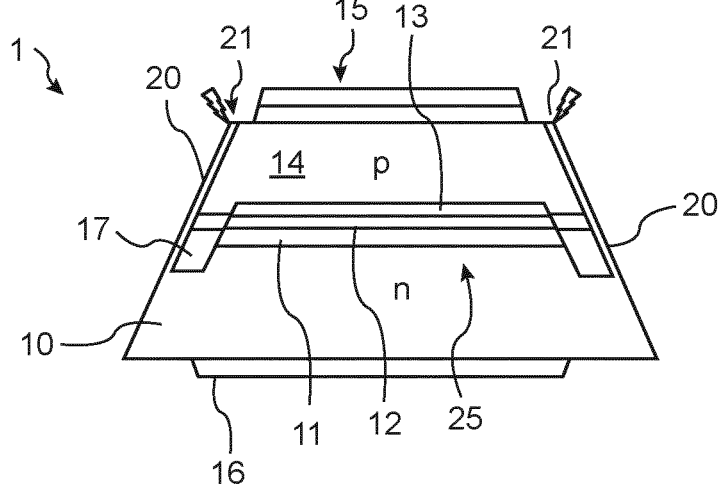
FIG. 2 illustrates an optoelectronic device in accordance with some aspects of the proposed principle.

To further reduce the amount of the non-radiative recombination, the inventor proposes depositing an additional small and n-doped layer on the sidewalls of the optoelectronic device, extending from the n-doped layer 10 across the quantum well intermixed region 17 all along up to the p-doped layer 14. A respective embodiment of such optoelectronic device is illustrated with its structure in FIG. 2. The thin n-doped surface layer 20 covers the sidewalls of the optoelectronic device and extends from n-doped layer 10 to the upper surface of the p-doped layer 14. As a result, an artificial pn-junction is created extending from an n-doped layer in towards the upper surface of the p-doped layer 14 and thereby crossing the quantum intermixed area 17. However, the created pn-junction is now buried within the material of the optoelectronic device itself. At the top surface of the p-doped layer, the artificial pn-junction extends to the surface, thus creating non-radiative recombination centers 22 at the top surface of the p-doped layer.

In contrast to the previous embodiment, the thin n-doped surface layer 21 comprises several benefits over the conventional solution. For once, the surface area exposed to or mainly responsible for non-radiative recombination is significantly smaller compared to the conventional embodiment. In addition, the thin surface layer 21 comprises a relatively large surface resistant resulting in a very low current through the pn-junction. In this regard, it should be noted that the pn-junction created by the thin surface layer and the p-doped material comprises a higher bandgap than the multi-quantum well layer 12. The larger bandgap combined with a larger surface resistance of the thin surface layer 21 results in a very small current through the artificial pn-junction and particularly, the numbers of charge carriers reaching the upper surface with a non-radiative recombination centers at the upper surface of the p-doped layer 14 is further reduced.

Figure 3:
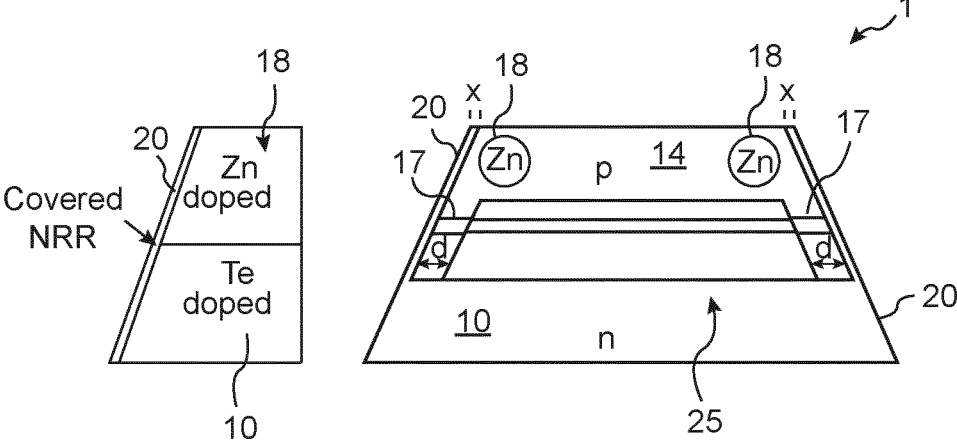
FIG. 3 shows another embodiment of an optoelectronic device in accordance with some aspects of the proposed principle

FIG. 3 illustrates a more detailed example according to some aspects of the proposed principle. In this embodiment, the n-doped layer 10 comprises Te as a dopant at the interface of the quantum well intermixed area 17, which in turn is generated by a p-dopant, namely Zn. A thin surface layer comprising an n-doped material layer is deposited on the surface of the mesa structure sidewalls. The thin surface layer covers the non-radiative recombination center at the pn-junction interface between Te-doped layer 10 and the Zn-doped area. The n-doped material layer 20 comprises Te as a dopant and includes a higher doping concentration compared to the quantum well intermixing dopant 18. The thickness x of the thinner surface layer 20 is significantly smaller than the quantum well intermixed area in the range from a few 10 nm to about 300 nm to 700 nm. The distance d of the quantum well intermixed area 17 between thin layer 20 to the active region 25 of the optoelectronic device given here by the multi-quantum well layer 12 is significantly larger and may range from about 100 nm to 1.5 μm.

FIGS. 4 to 8 illustrate various steps of the manufacturing method in accordance with the proposed principle.

Figures 4, 5, 6:
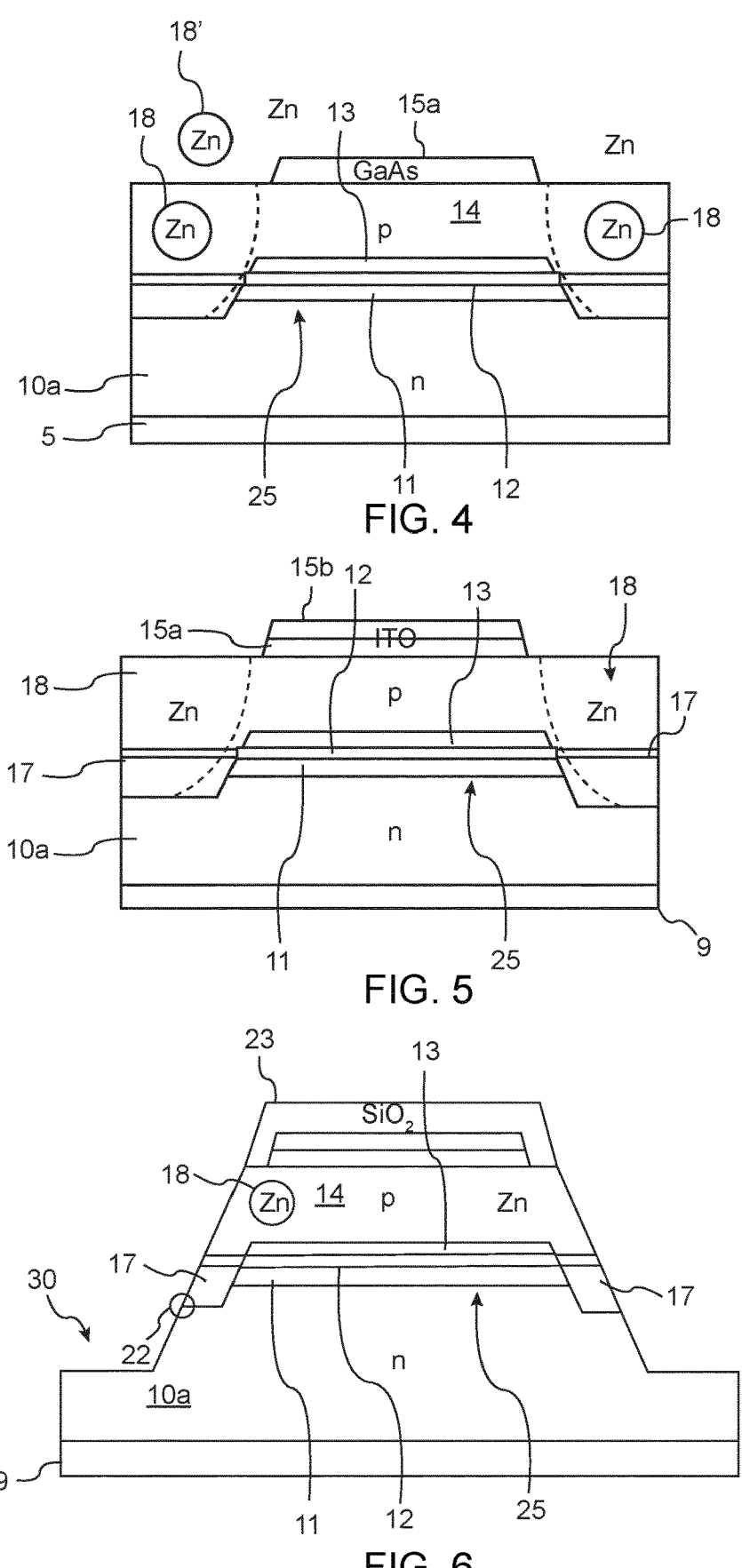
FIG. 4 shows an intermediate structure during the manufacturing process in accordance with some aspects of the proposed principle.
FIG. 5 illustrates a subsequent step of the manufacturing process in accordance with some aspects of the proposed principle.
FIG. 6 illustrates the intermediate structure after two further manufacturing process steps in accordance with some aspects of the proposed principle.
Figure 7:
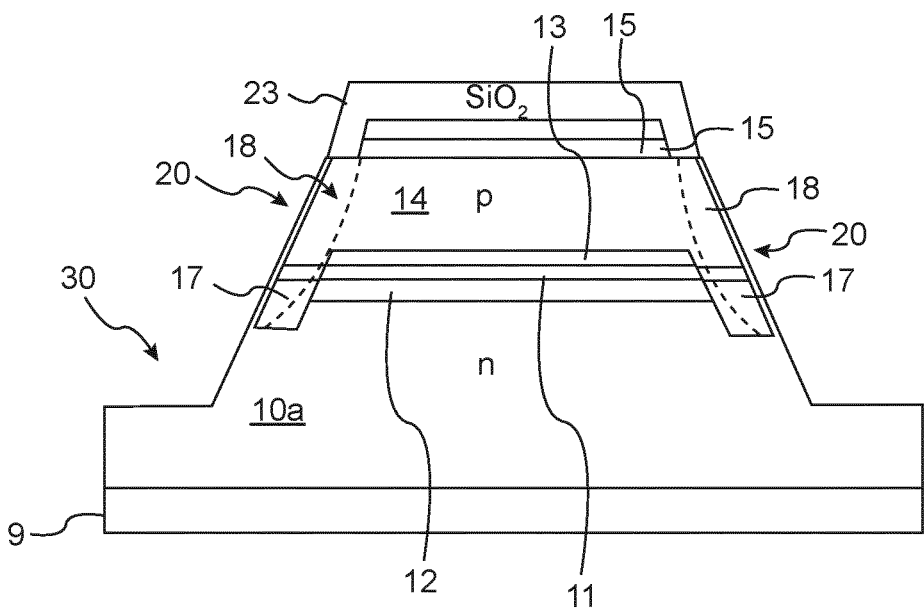
FIG. 7 shows a subsequent step of the manufacturing process in accordance with some aspects of the proposed principle.

In FIG. 4, an optoelectronic device is arranged on a substrate 9. For manufacturing purposes on the substrate 9, a first n-doped layer 10a is deposited. The n-doped layer 10a may comprise one or more sacrificial layers (not explicitly shown herein) for a later re-bonding step and may further include layers with different concentrations of dopants. While in this embodiment Te as dopant is used, other dopant is suitable for the respective base material can be used as well. N-doped layer 10a includes a highly n-doped current distribution layer.

On top of n-doped layer 10a, a first intrinsic layer 11 comprising the same base material as layer 10a is deposited. The deposition can be done in a continuous step by growing (using MOCVD or MOVPE or other suitable depositing processes) the base material and adjusting the respective Te dopant in suitable concentrations. Then, a multi-quantum well layer 12 is deposited and arranged on the intrinsic layer 11 followed by a second intrinsic layer 13. The second intrinsic layer 13 comprises the same base material as the following p-doped layer 14. P-doped layer 14 may comprise one or more additional layers suitable for example, for current distribution. Similar to the deposition of layers 10a and 11, layers 13 and p-doped layer 14 are deposited using MOVCD, MOVPE or other suitable processes and adjusting the respective dopant concentration.

The existing layer stack can be manufactured and processed using various depositing methods like for instance MOCVD, MOVPE and the like. After the p-doped layer 14 is deposited, a first structured mask is arranged on the top surface of the p-doped layer 14. For this purpose, a layer of GaAs is deposited on the p-doped layer 14 and subsequently structured such that the gallium arsenide material remains over areas of the multi-quantum well layer 12 later forming the active region. The GaAs layer 15a therefore acts as a mask.

The structured GaAs mask 15a may also be used as p-contact in a later step and is highly doped to reduce its area resistance. After structuring the GaAs mask 15a, a p-type dopant 18, in this example Zn 18, is deposited at a first temperature on the exposed surface of the p-doped layer 14 in a first step. Then Zn dopant 18 is diffused into the p-doped layer 14 at a second temperature higher than the first temperature, thus creating additional dopant within an area surrounding the active region. The diffusion process together with a subsequent optional annealing step at yet another temperature generates areas 17, in which quantum well intermixing takes place. The quantum well intermixed areas surround the active region 25.

The surrounded region 25 comprises portions of the intrinsic layer 13, the quantum well layer 12 and the second intrinsic layer 11. In addition, as illustrated in FIG. 4, the dopant concentration will at least partially diffuse into the n-doped layer region 10a, thus creating at least an extension of the intrinsic portion and in some occurrences an artificial pn-junction between the n-doped layer 10a and the quantum well intermixed area 17.

FIG. 5 the p-type contact 15 is further processed by depositing a transparent conductive material like ITO as layer 15b onto GaAs contact layer 15a.

Then according to FIG. 6, a second structured mask 23 is provided on parts of the surface of the optoelectronic device covering p-contact 15, as well as adjacent surrounding portion of p-doped layer 14. The hard mask 23 may include SiO$_2$ or other suitable materials, which are resistant to the subsequent mesa-structuring step illustrated in FIG. 6.

During the mesa-structuring step an etching process is applied, removing portions of the quantum well intermixed area 17, the n-doped layer 14 and n-doped layer 10a, thus exposing a side edge of the optoelectronic device from the top of p-doped layer 14 down to the n-doped layer 10a. The optoelectronic device therefore comprises sidewalls exposing the quantum well intermixed area 17 adjacent to the active region layer. Further, as shown herein the sidewalls may be inclined, whereas the inclination may depend on the manufacturing method and the etching step performed.

In a subsequent step, an n-type dopant is now deposited on the sidewalls and subsequently diffused into the sidewalls of the optoelectronic device and the sidewalls of its mesa structure. Te or any other suitable n-type dopant is used. The diffusion process will change the dopant concentration within a close surface area resulting in a thin n-doped surface layer 20 extending from the n-doped layer 10a across the quantum well intermixed area 17 all the way up to the hard mask at the surface of the p-doped layer 14. The concentration of the n-dopant is selected such that the conduction type in the quantum well intermixed area 17 as well as in the p-doped layer 14 at the surface changes from a p-type to an n-type material. As a result, an artificial pn-junction is generated at the interface between the thin surface layer 20 on the one side and the quantum well intermixed area 17 as well as the p-doped layer 14 on the other side. The pn-junction is buried within the material of the optoelectronic device. The band gap of this artificially created pn-junction is larger than the band gap within the quantum well layer 12. Further, the thickness of the surface layer 20 is very small, thus generating a high surface resistance for potential charge carriers moving into the active region of the pn-junction.

Consequently, the residual current through the artificially created pn-junction is very small compared to the current through the quantum well layer 12. Furthermore, in accordance with the proposed principle, any non-radiative recombination centers are moved from the sidewalls and the interface of the quantum well intermixed area 17 and the n-doped layer 10a to the upper surface of the p-doped layer 14. That is the centers are located much further away from the active region than in the conventional solution without the thin surface layer. Due to the inclination of the sidewalls, the non-radiative recombination area is smaller compared to the conventional solution. In addition, due to the high surface resistance only a very small current will flow through the artificially created pn-junction and even less current will reach the non-radiative recombination centers at the top.

Figure 8:
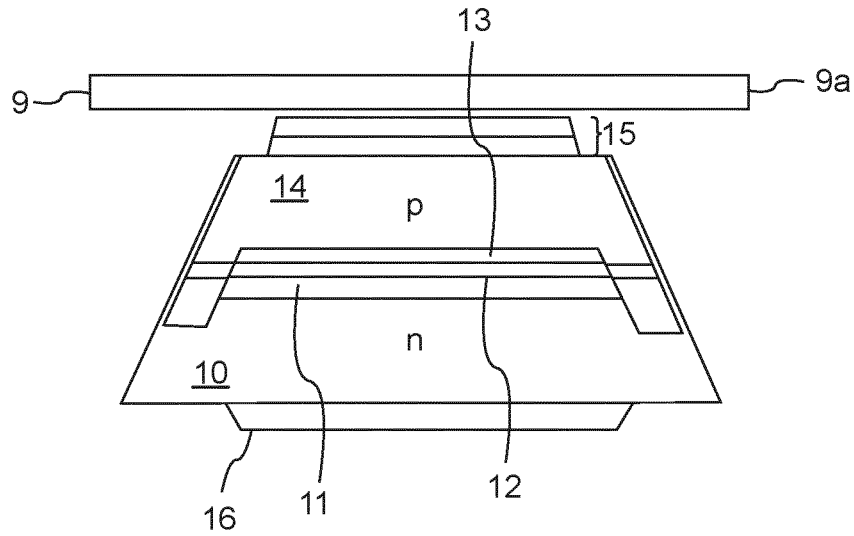
FIG. 8 shows an optoelectronic device in accordance with some aspects of the proposed principle.

FIG. 8 illustrates a further method step in accordance with the proposed principle. The optoelectronic device is re-bonded and attached to a temporary support a carrier, 9a. In a subsequent step, the material of the n-doped layer 10a is removed, until the mesa structure is opened and the opto-electronic devices separated. Contacts 16 are applied to the surface of the n-doped layer 10 after separation of the optoelectronic devices.

The invention claimed is:

1. A method for processing an optoelectronic device, the method comprising:
  providing a carrier substrate;
  depositing a first n-doped layer on the carrier substrate;
  depositing an active region layer on the first n-doped layer;
  depositing a p-doped layer on the active region layer;
  depositing a first structured mask on the p-doped layer defining first areas within the active region layer below the first structured mask;
  diffusing a p-type dopant thereby causing a quantum well intermixing in second areas adjacent to the first areas;
  depositing a second structured mask on the p-doped layer covering the first areas within the active region layer and parts of the second areas adjacent to the first areas;
  forming a mesa structure adjacent to the parts of the second areas, wherein the mesa structure extends to the first n-doped layer thereby exposing a pn-junction between the first n-doped layer and a p-type dopant-doped region along its sidewall; and
  creating a thin n-type surface layer on sidewalls extending from the first n-doped layer substantially to the surface of the p-doped layer.

2. The method according to claim 1, wherein the first structured mask comprises an electrically conductive material.

3. The method according to claim 1, wherein depositing the active region layer comprises depositing a quantum well or multi-quantum well layer structure.

4. The method according to claim 1, wherein depositing the active region layer comprises depositing a non-doped or slightly n-doped layer onto the n-doped layer prior to depositing the active layer region structure.

5. The method according to claim 1, wherein depositing the p-doped layer comprises depositing a non-doped or slightly p-doped layer onto the active region layer prior to depositing the p-doped layer.

6. The method according to claim 1, wherein the dopant for the n-doped layer is selected from the group consisting of tellurium, silicon, and selenium, and wherein the dopant for the p-doped layer is selected from the group consisting of magnesium and zinc.

7. The method according to claim 1, wherein diffusing the p-type dopant comprises:
  depositing the dopant at a first temperature on the p-doped layer; and
  diffusing the dopant into the p-doped layer at a second temperature being at least partially higher than the first temperature.

8. The method according to claim 1, wherein depositing the second structured mask comprises:
  depositing a mask layer being a $SiO_2$ layer on the p-doped layer and optionally onto the first structured mask; and
  structuring the second mask on the p-doped layer such that regions above the second area surrounding the first area are removed.

9. The method according to claim 1, wherein forming the mesa structure comprises etching a material of the p-doped layer including the dopant, the active layer region and a portion of the first n-doped region to form one or more cavities building the mesa structure, and wherein optionally the sidewalls of the cavity are inclined with regards to a bottom of the n-doped layer in the mesa structure.

10. The method according to claim 1, wherein creating the thin n-type surface layer on the sidewalls comprises:
  depositing n-type dopant being Te or Se onto the sidewall surface; and
  diffusing the deposited dopant into the sidewall surface, wherein a concentration of the deposited dopant is selected such that, after diffusing deposited dopant into the sidewall surface, the sidewall comprises the n-type surface layer.

11. The method according to claim 10, wherein depositing comprises:
  evaporating or sputtering the n-type dopant at a first temperature on the sidewall surface; or
  depositing n-type dopant by Metalorganic vapor-phase epitaxy at the first temperature on the sidewall surface; and
  diffusing the dopant into the sidewall surface at a second temperature being at least partially higher than the first temperature.

12. The method according to claim 1, wherein the p-type dopant is Zn.

13. An optoelectronic device comprising:
  a layer stack having a circumferential sidewall region and comprising:
    an n-doped layer;
    an active region layer deposited on the n-doped layer, the active region layer having a central first portion and a surrounding second portion;
    a p-doped layer arranged on the active region layer, wherein the surrounding second portion comprises a p-type dopant causing a quantum well intermixing in the surrounding second portion; and
    a thin n-doped surface layer on the circumferential sidewall extending from the n-doped layer substantially towards a top of the p-doped layer thereby forming an artificial pn-junction substantially parallel to the circumferential sidewall region and at least partially within the surrounding second portion and the p-doped layer.

14. The optoelectronic device according to claim 13, wherein the thin n-doped surface layer comprises a thickness in a range of 10 nm to 250 nm.

15. The optoelectronic device according to claim 13, wherein the p-type dopant at least partially extends close to or into the n-doped layer forming the artificial pn-junction surrounding the central first portion.

16. The optoelectronic device according to claim 13, wherein the surrounding second portion comprises a lateral width of at last 500 nm.

17. The optoelectronic device according to claim 13, wherein the p-type dopant comprises Zn and the n-doped surface layer comprises Te.

18. The optoelectronic device according to claim 13, wherein the n-doped surface layer comprises the p-type dopant, and an n-type dopant of a higher concentration than the p-type dopant.

* * * * *